United States Patent
Byeon

(10) Patent No.: US 10,043,588 B2
(45) Date of Patent: Aug. 7, 2018

(54) MEMORY DEVICE

(71) Applicant: SK hynix Inc., Gyeonggi-do (KR)

(72) Inventor: Sang-Jin Byeon, Gyeonggi-do (KR)

(73) Assignee: SK Hynix Inc., Gyeonggi-do (KR)

(*) Notice: Subject to any disclaimer, the term of this patent is extended or adjusted under 35 U.S.C. 154(b) by 0 days.

(21) Appl. No.: 15/380,475

(22) Filed: Dec. 15, 2016

(65) Prior Publication Data

US 2018/0174664 A1    Jun. 21, 2018

(51) Int. Cl.
```
G06F 11/00    (2006.01)
G11C 29/36    (2006.01)
G06F 11/10    (2006.01)
G11C 29/52    (2006.01)
G11C 29/42    (2006.01)
G11C 29/44    (2006.01)
G01R 31/317   (2006.01)
```
(52) U.S. Cl.
CPC ........ *G11C 29/36* (2013.01); *G01R 31/31701* (2013.01); *G06F 11/1068* (2013.01); *G11C 29/42* (2013.01); *G11C 29/44* (2013.01); *G11C 29/52* (2013.01); *G11C 2029/3602* (2013.01)

(58) Field of Classification Search
None
See application file for complete search history.

(56) References Cited

U.S. PATENT DOCUMENTS

| | | | | |
|---|---|---|---|---|
| 5,786,951 | A * | 7/1998 | Welland | G11B 5/09 360/46 |
| 6,751,756 | B1 * | 6/2004 | Hartnett | G06F 9/30145 711/E12.017 |
| 2004/0243887 | A1 | 12/2004 | Sharma et al. | |
| 2012/0266033 | A1 * | 10/2012 | Gold | G06F 11/1052 714/718 |
| 2013/0139008 | A1 | 5/2013 | Kalyanasundharam et al. | |
| 2013/0326302 | A1 * | 12/2013 | Han | H03M 13/1142 714/752 |
| 2015/0318058 | A1 * | 11/2015 | Curley | G06F 12/0253 714/41 |

* cited by examiner

*Primary Examiner* — Daniel McMahon
(74) *Attorney, Agent, or Firm* — IP & T Group LLP

(57) ABSTRACT

A memory device includes a normal cell array, a parity cell array, and a plurality of normal write drivers suitable for writing normal write data in the normal cell array. The memory device also includes a plurality of parity write drivers suitable for writing parity write data corresponding to the normal write data, in the parity cell array, and an error injection circuit suitable for injecting error write data to at least one among the plurality of the normal write drivers and the plurality of the parity write drivers to exactly analyze an error of the memory device.

15 Claims, 4 Drawing Sheets

MEMORY DEVICE

BACKGROUND

1. Field

Exemplary embodiments of the present invention relate to a memory device including an Error Code Correction (ECC) logic.

2. Description of the Related Art

In the early days of the semiconductor memory device industry, the percentage of original good dies was very high. An original good die is a memory chip on a wafer that is produced from a semiconductor fabrication process without any defective memory cells. However, as the capacity of memory devices has increased gradually, it has now become very difficult to fabricate a memory device that is completely free from a defective memory cell. Nowadays, it is rather unlikely that a memory device is fabricated without any defective memory cell.

Hence, various methods have been developed for addressing this concern. One, widely used method, is a repairing method which employs a plurality of redundant memory cells in a memory device and replaces any defective cells with redundant memory cells. Another method is an Error Code Correction (ECC) method in which a memory device is provided with an Error Code Correction (ECC) logic for correcting errors occurring in the memory device. An ECC method has a shortcoming in that when the ECC logic is used and an error occurs in a memory device, it is difficult to determine whether the error has occurred in a memory cell or whether the error has occurred in the ECC logic itself.

SUMMARY

Embodiments of the present invention are directed to a method that makes it possible for a memory device to exactly analyze an error of the memory device including an Error Code Correction (ECC) logic.

In accordance with an embodiment of the present invention, a memory device includes: a normal cell array; a parity cell array; a plurality of normal write drivers suitable for writing normal write data in the normal cell array; a plurality of parity write drivers suitable for writing parity write data corresponding to the normal write data, in the parity cell array; and an error injection circuit suitable for injecting error write data to at least one among the plurality of the normal write drivers and the plurality of the parity write drivers.

The error write data may include at least one among an error inputted from outside of the memory device, an error of a predetermined pattern that is generated in the memory device, and a random error that is generated in the memory device.

The memory device may further include: a plurality of normal input/output sense amplifiers suitable for reading normal read data from the normal cell array; and a plurality of parity input/output sense amplifiers suitable for reading parity read data from the parity cell array, wherein the error injection circuit injects error read data to at least one among the plurality of the normal input/output sense amplifiers and the plurality of the parity input/output sense amplifiers.

The error read data may include at least one among an error inputted from an outside of the memory device, an error of a predetermined pattern that is generated in the memory device, and a random error that is generated in the memory device.

The memory device may further include: a plurality of data pads; a plurality of data receiving circuits suitable for receiving the normal write data that are inputted to the plurality of the data pads; a plurality of data transferring circuits suitable for transferring the normal read data to the plurality of the data pads; and a normal global data bus suitable for transferring the normal write data from the plurality of the data receiving circuits to the plurality of the normal write drivers, and transferring the normal read data to the plurality of the data transferring circuits from the plurality of the normal input/output sense amplifiers.

The memory device may further include: a parity generation circuit suitable for generating the parity write data to be written in the parity cell array, based on the normal write data transferred from the plurality of the data receiving circuits; an error correction circuit suitable for correcting an error of the normal read data transferred from the plurality of the normal input/output sense amplifiers, based on the parity read data transferred from the plurality of the parity input/output sense amplifiers; and a parity global data bus suitable for transferring the parity write data from the parity generation circuit to the plurality of the parity write drivers, and transferring the parity read data from the plurality of the parity input/output sense amplifiers to the error correction circuit.

The error input circuit may include: a normal error write data storage suitable for storing first normal error write data that are inputted from an outside of the memory device; a normal error write data generator suitable for generating second normal error write data; a first selector suitable for selecting one of the first normal error write data and the second normal error write data to output normal error write data; and a second selector suitable for selecting one of the normal write data and the normal error write data, and outputting the selected data to the plurality of the normal write drivers.

The error input circuit may further include: a parity error write data storage suitable for storing first parity error write data that are inputted from the outside of the memory device; a parity error write data generator suitable for generating second parity error write data; a third selector suitable for selecting one of the first parity error write data and the second parity error write data to output parity error write data; and a fourth selector suitable for selecting one of the parity write data and the parity error write data, and outputting the selected data to the plurality of the parity write drivers.

The error input circuit may further include: a normal error read data storage suitable for storing first normal error read data that are inputted from the outside of the memory device; a normal error read data generator suitable for generating second normal error read data; a fifth selector suitable for selecting one of the first normal error read data and the second normal error read data to output normal error read data; and a sixth selector suitable for selecting one of the normal read data and the normal error read data, and outputting the selected data to the plurality of the normal input/output sense amplifiers.

The error input circuit may further include: a parity error read data storage suitable for storing first parity error read data that are inputted from the outside of the memory device; a parity error read data generator suitable for generating second parity error read data; a seventh selector suitable for selecting one of the first parity error read data and the second parity error read data to output parity error read data; and an eighth selector suitable for selecting one of the parity read data and the parity error read data, and outputting the selected data to the plurality of the parity input/output sense amplifiers.

In accordance with another embodiment of the present invention, a memory device includes: a normal cell array; a parity cell array; a plurality of normal input/output sense amplifiers suitable for reading normal read data from the normal cell array; a plurality of parity input/output sense amplifiers suitable for reading parity read data corresponding to the normal read data from the parity cell array; and an error injection circuit suitable for injecting error read data to at least one among the plurality of the normal input/output sense amplifiers and the plurality of the parity input/output sense amplifiers.

The error read data may include at least one among an error inputted from an outside of the memory device, an error of a predetermined pattern that is generated in the memory device, and a random error that is generated in the memory device.

The memory device may further include: a plurality of data pads; a plurality of data transferring circuits suitable for transferring the normal read data to the plurality of the data pads; an error correction circuit suitable for correcting an error of the normal read data transferred from the plurality of the normal input/output sense amplifiers by using the parity read data transferred from the plurality of the parity input/output sense amplifiers so as to produce error-corrected normal read data, and transferring the error-corrected normal read data to the plurality of the data transferring circuits; and a parity global data bus suitable for transferring the parity read data from the plurality of the parity input/output sense amplifiers to the error correction circuit.

The error input circuit may include: a normal error read data storage suitable for storing first normal error read data that are inputted from an outside of the memory device; a normal error read data generator suitable for generating second normal error read data; a first selector suitable for selecting one of the first normal error read data and the second normal error read data to output normal error read data; and a second selector suitable for selecting one of the normal read data and the normal error read data, and outputting the selected data to the plurality of the normal input/output sense amplifiers.

The normal error read data generator may generate the second normal error read data in response to a plurality of test mode signals.

The error input circuit may further include: a parity error read data storage suitable for storing first parity error read data that are inputted from the outside of the memory device; a parity error read data generator suitable for generating second parity error read data; a third selector suitable for selecting one of the first parity error read data and the second parity error read data to output parity error read data; and a fourth selector suitable for selecting one of the parity read data and the parity error read data, and outputting the selected data to the plurality of the parity input/output sense amplifiers.

The parity error read data generator may generate the second parity error read data in response to a plurality of test mode signals.

BRIEF DESCRIPTION OF THE DRAWINGS

The above and other features and advantages of the present invention will become more apparent to those skilled in the art to which the present invention pertains by the following description with reference to the attached drawings in which.

DETAILED DESCRIPTION

Figure 1:
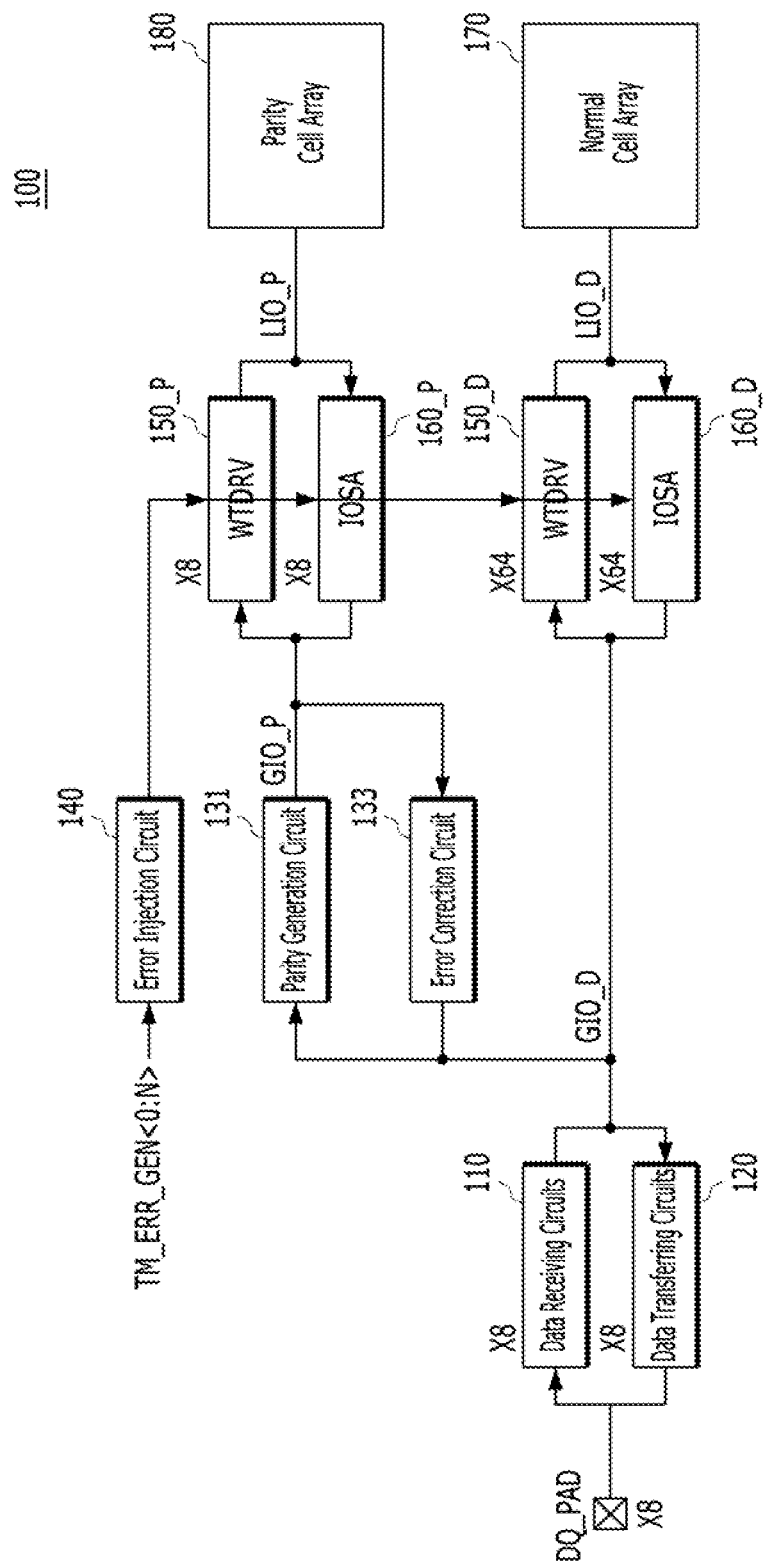
FIG. 1 is a block diagram illustrating a memory device in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the present invention to those skilled in the art. Throughout the disclosure, like reference numerals refer to like parts throughout the various figures and embodiments of the present invention.

It is noted that the drawings are simplified schematics and as such are not necessarily drawn to scale. In some instances, various parts of the drawings may have been exaggerated in order to more clearly illustrate certain features of the illustrated embodiments.

It is further noted that in the following description, specific details are set forth for facilitating the understanding of the present invention, however, the present invention may be practiced without some of these specific details. Also, it is noted, that well-known structures and/or processes may have only been described briefly or not described at all to avoid obscuring the present disclosure with unnecessary well known details.

It is also noted, that in some instances, as would be apparent to those skilled in the relevant art, an element (also referred to as a feature) described in connection with one embodiment may be used singly or in combination with other elements of another embodiment, unless specifically indicated otherwise.

Hereinafter, the various embodiments of the present invention will be described in detail with reference to the attached drawings.

FIG. 1 is a block diagram illustrating a memory device 100 in accordance with an embodiment of the present invention.

Referring to FIG. 1, the memory device 100 includes a plurality of data pads DQ_PAD, a plurality of data receiving circuits 110, a plurality of data transferring circuits 120, a parity generation circuit 131, an error correction circuit 133, an error injection circuit 140, a plurality of normal write drivers 150_D, a plurality of parity write drivers 150_P, a plurality of normal input/output sense amplifiers 160_D, a plurality of parity input/output sense amplifiers 160_P, a normal global data bus GIO_D, a parity global data bus GIO_P, a normal local data bus LIO_D, a parity local data bus LIO_P, a normal cell array 170, and a parity cell array 180.

The term "normal data" is used to distinguish data from parity data. Hereafter, parity data is data used for correcting an error of the normal data and normal data is any other data stored in the memory device 100. In a write operation, normal data inputted from the data pads DQ_PAD to the normal cell array 170 are referred to as normal write data. Also, in a read operation, normal data inputted from the normal cell array 170 to the data pads DQ_PAD are referred to as normal read data. Also, in a write operation, parity data inputted from the parity generation circuit 131 to the parity cell array 180 are referred to as parity write data. Also, in a read operation, parity data inputted from the parity cell array 180 to the error correction circuit 133 are referred to as parity read data.

The normal data of the memory device 100 may be inputted to or outputted from the data pads DQ_PAD. Although FIG. 1 shows a case where there is one data pad DQ_PAD, the number of the data pads DQ_PAD may be plural. As an example, it is assumed herein that there are eight data pads DQ_PAD.

The data receiving circuits 110 may receive normal write data that are inputted to the data pads DQ_PAD in a write operation. The number of the data receiving circuits 110 may be the same as the number of the data pads DQ_PAD. In a write operation, consecutive normal write data may be serially inputted to each of the data pads DQ_PAD. For example, eight consecutive normal write data may be serially inputted to each of the data pads DQ_PAD. Each of the data receiving circuits 110 may then perform a serial-to-parallel conversion operation on the received normal write data. For example, each of the data receiving circuits 110 may perform a serial-to-parallel conversion operation on the normal write data in 1:8. When each of the eight data receiving circuits 110 has performed the serial-to-parallel conversion operation on the normal write data in the 1:8 format, 64 bits of normal write data may be loaded on the normal global data bus GIO_D in parallel.

The normal write drivers 150_D may write the normal write data that are transferred through the normal global data bus GIO_D, in the normal cell array 170. The number of the normal write drivers 150_D may be 64 to accommodate the 64 bits of data that are transferred simultaneously through the global data bus GI0_D. The normal write data may be transferred from the normal write drivers 150_D to the normal cell array 170 through the normal local data bus LIO_D.

The parity generation circuit 131 may receive the normal write data that are transferred from the data receiving circuits 110 through the normal global data bus GIO_D, and generate parity write data based on the received normal write data. The parity write data are data used for detecting and correcting an error in the normal write data. For example, an 8-bit parity write data may be generated for the 64-bit normal write data. The parity write data generated in the parity generation circuit 131 may then be transferred to the parity global data bus GIO_P.

The parity write drivers 150_P may write the parity write data transferred through the parity global data bus GIO_P, in the parity cell array 180. The number of the parity write drivers 150_P may be 8. The parity write data may be transferred from the parity write drivers 150_P to the parity cell array 180 through the parity local data bus LIO_P.

The normal input/output sense amplifiers 160_D may read normal read data from the normal cell array 170. The normal input/output sense amplifiers 160_D may transfer the normal read data to the normal global data bus GIO_D. The normal read data may be transferred to the normal input/output sense amplifiers 160_D from the normal cell array 170 through the normal local data bus LIO_D. The number of the normal input/output sense amplifiers 160_D may be 64.

The parity input/output sense amplifiers 160_P may read parity read data from the parity cell array 180. The parity input/output sense amplifiers 160_P may transfer the parity read data to the parity global data bus GIO_P. The parity read data may be transferred to the parity input/output sense amplifiers 160_P from the parity cell array 180 through the parity local data bus LIO_P. The number of the parity write drivers 150_P may be 8.

The error correction circuit 133 may correct an error in the normal read data that are loaded on the normal global data bus GIO_D by using the parity read data that are transferred from the parity global data bus GIO_P.

The data transferring circuits 120 may receive the error-corrected normal read data which were obtained in the error correction circuit 133 and may transfer them to an external device, i.e., a device that is external to the memory device 100 through the data pads DQ_PAD. Each of the data transferring circuits 120 may perform a parallel-to-serial conversion operation on the 64 normal read data that are loaded on the normal global data bus GIO_D. Then, eight normal read data may be serially outputted to each of the eight data pads DQ_PAD.

The error injection circuit 140 may inject an error into at least one among the normal write drivers 150_D and the parity write drivers 150_P In a write operation. The error injected by the error injection circuit 140 may be written in a portion of the normal cell array 170 and the parity cell array 180, instead of the normal write data and the parity write data that are transferred through the normal global data bus GIO_D and the parity global data bus GIO_P, respectively. The error injection circuit 140 may inject an error into at least one among the normal input/output sense amplifiers 160_D and the parity input/output sense amplifiers 160_P In a read operation. The error injected by the error injection circuit 140 may be read through the normal input/output sense amplifiers 160_D and the parity input/output sense amplifiers 160_P, instead of the normal read data and the parity read data that are transferred through the normal local data bus LIO_D and the parity local data bus LIO_P from a portion of the normal cell array 170 and the parity cell array 180, respectively. Since it is possible to inject as many as desired normal data errors and parity data errors in a write operation and a read operation of the memory device 100 due to the presence of the error injection circuit 140, it is possible to accurately analyze the defects of the memory device 100. The error injected by the error injection circuit 140 may include an error inputted from the outside of the memory device 100 (i.e., an external device), an error of a predetermined pattern that is generated by the memory device 100, and a random error that is generated by the memory device 100. Here, the error of a predetermined pattern and the random error may be generated by the memory device 100 in response to a plurality of test mode signals TM_ERR_GEN<0:N>

The structure and operation of the error injection circuit 140 and a connection between the error injection circuit 140 and any of the normal write drivers 150_D, the parity write drivers 150_P, the normal input/output sense amplifiers 160_D, and the parity input/output sense amplifiers 160_P will be described in detail by referring to FIGS. 2 to 5.

Figure 2:
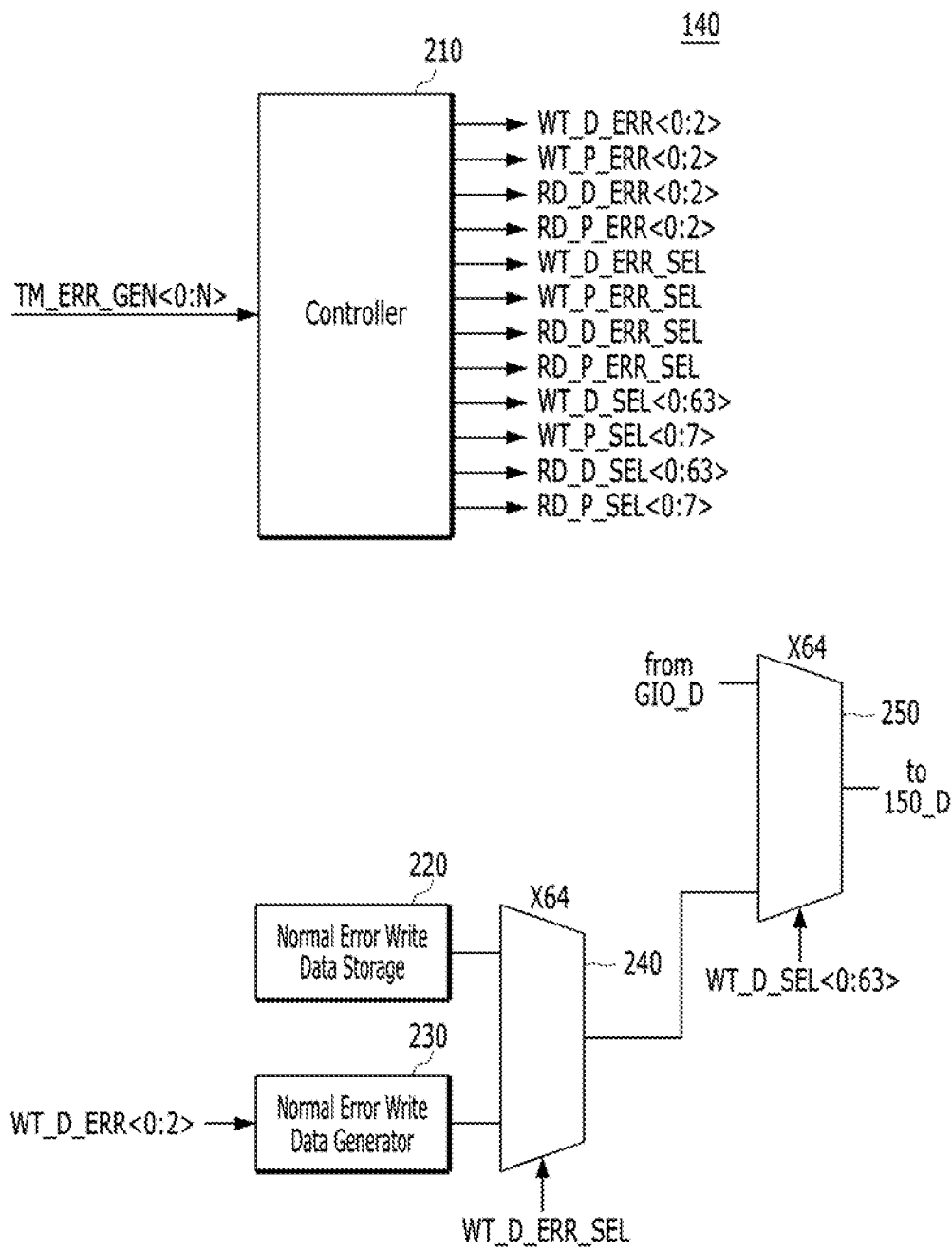
FIG. 2 is a block diagram illustrating a portion of an error injection circuit of FIG. 1 employed for injecting an error into a plurality of normal write drivers.

FIG. 2 is a block diagram illustrating a portion of the error injection circuit 140 of FIG. 1 employed for injecting an error into the normal write drivers 150_D.

Referring to FIG. 2, the error injection circuit 140 may include a controller 210, a normal error write data storage 220, a normal error write data generator 230, and first and second selectors 240 and 250.

The controller 210 may generate signals needed for an operation of the error injection circuit 140, which include signals WT_D_ERR<0:2>, WT_P_ERR<0:2>, RD_D_ERR<0:2>, RD_P_ERR<0:2>, WT_D_ERR_SEL, WT_P_ERR_SEL, RD_D_ERR_SEL, RD_P_ERR_SEL, WT_D_SEL<0:63>, WT_P_SEL<0:7>, RD_D_SEL<0:63>, and RD_P_SEL<0:7>, based on a plurality of test mode signals TM_ERR_GEN<0:N>. The test mode signals TM_ERR_GEN<0:N> may be generated as combinations of command signals and address signals that are inputted to the memory device 100. The logic values of the signals WT_D_ERR<0:2>, WT_P_ERR<0:2>, RD_D_ERR<0:2>, RD_P_ERR<0:2>, WT_D_ERR_SEL, WT_P_ERR_SEL, RD_D_ERR_SEL, RD_P_ERR_SEL, WT_D_SEL<0:63>, WT_P_SEL<0:7>, RD_D_SEL<0:63>, and RD_P_SEL<0:7> may be decided according to the logic values of the test mode signals TM_ERR_GEN<0:N>.

Here, first to fourth pattern source signals WT_D_ERR<0:2>, WT_P_ERR<0:2>, RD_D_ERR<0:2>, and RD_P_ERR<0:2> may be used to generate a random error or an error of a predetermined pattern, respectively for the normal write drivers 150_D, the parity write drivers 150_P, the normal input/output sense amplifiers 160_D and the parity input/output sense amplifiers 160_P (see FIG. 1). First to fourth error selection signals WT_D_ERR_SEL, WT_P_ERR_SEL, RD_D_ERR_SEL, and RD_P_ERR_SEL may be used to select one of errors, such as an error inputted from the outside of the memory device 100, the random error, and the error of a predetermined pattern. First to fourth output selection signals WT_D_SEL<0:63>, WT_P_SEL<0:7>, RD_D_SEL<0:63>, and RD_P_SEL<0:7> may be used to select one of an error provided from the error injection circuit 140, and normal/parity data transferred from the normal/parity global data buses GIO_D and GIO_P and the normal/parity local data buses LIO_D and LIO_P.

The normal error write data storage 220 may store first normal error write data inputted from the outside of the memory device 100. The normal error write data storage 220 may receive and store the first normal error write data by using some of diverse pads of the memory device 100, such as the data pads DQ_PAD and address pads of the memory device 100. The first normal error write data may be 64 bits.

The normal error write data generator 230 may generate second normal error write data. The normal error write data generator 230 may generate the second normal error write data by selecting a random error or an error of a predetermined pattern in response to the first pattern source signals WT_D_ERR<0:2>. To take an example, when the first pattern source signals WT_D_ERR<0:2> have a value of '000', the normal error write data generator 230 may generate a random 64-bit normal error write data. When the first pattern source signals WT_D_ERR<0:2> have a value of '001', the normal error write data generator 230 may generate a 64-bit normal error write data having a pattern, for example, a pattern of '1010 . . . 10', which is one among many predetermined patterns. When the first pattern source signals WT_D_ERR<0:2> have a value of '010', the normal error write data generator 230 may generate a 64-bit normal error write data having yet another pattern of '1111 . . . 11', which is also one among the predetermined patterns. Likewise, when the first pattern source signals WT_D_ERR<0:2> have other values, the normal error write data generator 230 then may generate normal error write data of other predetermined patterns.

The first selectors 240 may select one of the first normal error write data stored in the normal error write data storage 220 and the second normal error write data generated in the normal error write data generator 230 in response to the first error selection signal WT_D_ERR_SEL. In other words, the first selectors 240 may select one of the errors inputted from the outside of the memory device 100 and the error generated inside the memory device 100. Since the normal error write data are 64 bits, the number of the first selectors 240 may be 64.

The second selectors 250 may select one of the normal error write data selected by the first selectors 240 and the normal write data transferred from the normal global data bus GIO_D, and output the selected data to the normal write drivers 150_D in response to the first output selection signals WT_D_SEL<0:63>. The number of the second selectors 250 may also be 64. Each of the 64 second selectors 250 may operate in response to a corresponding one of the 64 first output selection signals WT_D_SEL<0:63>. The number of errors in the data that are written by the normal write drivers 150_D may be controlled from 0 to 64 by controlling the levels of the 64 first output selection signals WT_D_SEL<0:63>.

Figure 3:
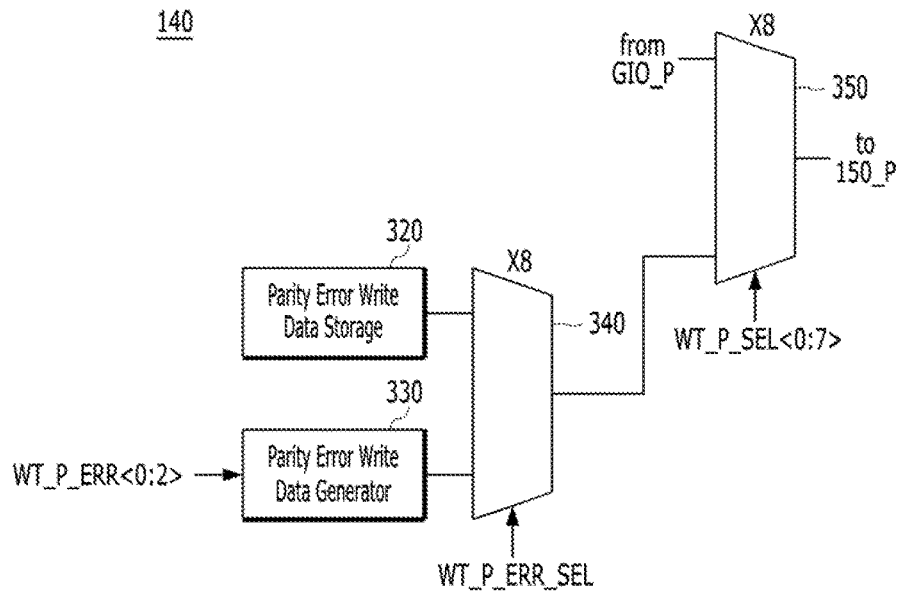
FIG. 3 is a block diagram illustrating a portion of the error injection circuit of FIG. 1 where an error is injected into a plurality of parity write drivers.

FIG. 3 is a block diagram illustrating a portion of the error injection circuit 140 of FIG. 1 which is employed for injecting employed for injecting an error into the parity write drivers 150_P.

Referring to FIG. 3, the error injection circuit 140 may include a parity error write data storage 320, a parity error write data generator 330, and third and fourth selectors 340 and 350 in addition to the constituent elements of FIG. 2.

The parity error write data storage 320 may store first parity error write data that are inputted from the outside of the memory device 100. The parity error write data storage 320 may receive and store the first parity error write data by using some of diverse pads of the memory device 100, such as the data pads DQ_PAD and address pads of the memory device 100. The first parity error write data may be 8 bits.

The parity error write data generator 330 may generate second parity error write data. The parity error write data generator 330 may generate the second parity error write data by selecting a random error or an error of a predetermined pattern in response to the second pattern source signals WT_P_ERR<0:2>. To take an example, when the second pattern source signals WT_P_ERR<0:2> have a value of '000', the parity error write data generator 330 may generate random 8-bit parity error write data. When the second pattern source signals WT_P_ERR<0:2> have a value of '001', the parity error write data generator 330 may generate 8-bit parity error write data having a pattern of '10101010', which is one among predetermined patterns. When the second pattern source signals WT_P_ERR<0:2> have a value of '010', the parity error write data generator 330 may generate 8-bit parity error write data having a pattern of '11111111', which is also one among the predetermined patterns. When the second pattern source signals WT_P_ERR<0:2> have other values, the parity error write data generator 330 may generate parity error write data of other patterns.

The third selectors 340 may select one of the first parity error write data stored in the parity error write data storage 320 and the second parity error write data generated in the parity error write data generator 330 in response to the second error selection signal WT_P_ERR_SEL. In other words, the third selectors 340 may select one of the error inputted from the outside of the memory device 100 and the error generated inside the memory device 100. Since the parity error write data are 8 bits, the number of the third selectors 340 may be 8.

The fourth selectors 350 may select one of the parity error write data selected by the third selectors 340 and the parity write data transferred from the parity global data bus GIO_P, and output the selected data to the parity write drivers 150_P In response to the second output selection signals WT_P_SEL<0:7>. The number of the fourth selectors 350 may be 8. Each of the 8 fourth selectors 350 may operate in response to a corresponding one of the 8 second output selection signals WT_P_SEL<0:7>. The number of errors in the parity data that are written by the parity write drivers 150_P may be controlled from 0 to 8 by controlling the levels of the 8 second output selection signals WT_P-_SEL<0:7>.

Figure 4:
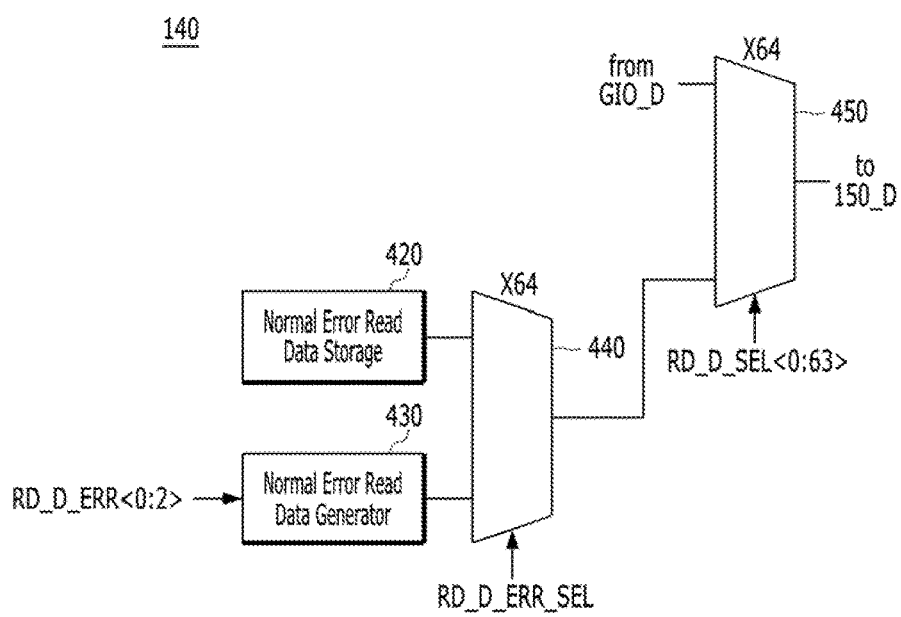
FIG. 4 is a block diagram illustrating a portion of the error injection circuit of FIG. 1 where an error is injected into a plurality of normal input/output sense amplifiers.

FIG. 4 is a block diagram illustrating a portion of the error injection circuit 140 of FIG. 1 employed for injecting an error into the normal input/output sense amplifiers 160_D.

Referring to FIG. 4, the error injection circuit 140 may include a normal error read data storage 420, a normal error read data generator 430, and fifth and sixth selectors 440 and 450 in addition to the constituent elements of FIGS. 2 and 3.

The normal error read data storage 420 may store first normal error read data inputted from the outside of the memory device 100. The normal error read data storage 420 may receive and store the first normal error read data by using some of diverse pads of the memory device 100, such as the data pads DQ_PAD and address pads of the memory device 100. The first normal error read data may be 64 bits.

The normal error read data generator 430 may generate second normal error read data. The normal error read data generator 430 may generate the second normal error read data by selecting a random error or an error of a predetermined pattern in response to the third pattern source signals RD_D_ERR<0:2>. To take an example, when the third pattern source signals RD_D_ERR<0:2> have a value of '000', the normal error read data generator 430 may generate random 64-bit normal error read data. When the third pattern source signals RD_D_ERR<0:2> have a value of '001', the normal error read data generator 430 may generate 64-bit normal error read data having a pattern of '1010 . . . 10', which is one among predetermined patterns. When the third pattern source signals RD_D_ERR<0:2> have a value of '010', the normal error read data generator 430 may generate 64-bit normal error read data having a pattern of '1111 . . . 11', which is also one among the predetermined patterns. When the third pattern source signals RD_D_ERR<0:2> have other values, the normal error read data generator 430 then may generate normal error read data of other patterns.

The fifth selectors 440 may select one of the first normal error read data stored in the normal error read data storage 420 and the second normal error read data generated in the normal error read data generator 430 in response to the third error selection signal RD_D_ERR_SEL. In other words, the fifth selectors 440 may select one of the error inputted from the outside of the memory device 100 and the error generated inside the memory device 100. Since the normal error read data are 64 bits, the number of the fifth selectors 440 may be 64.

The sixth selectors 450 may select one of the normal error read data selected by the fifth selectors 440 and the normal read data transferred from the normal local data bus LIO_D, and output the selected data to the normal input/output sense amplifiers 160_D in response to the third output selection signals RD_D_SEL<0:63>. The number of the sixth selectors 450 may be 64. Each of the 64 sixth selectors 450 may operate in response to a corresponding one of the 64 third output selection signals RD_D_SEL<0:63>. The number of errors in the data that are read by the normal input/output sense amplifiers 160_D may be controlled from 0 to 64 by controlling the levels of the 64 third output selection signals RD_D_SEL<0:63>.

Figure 5:
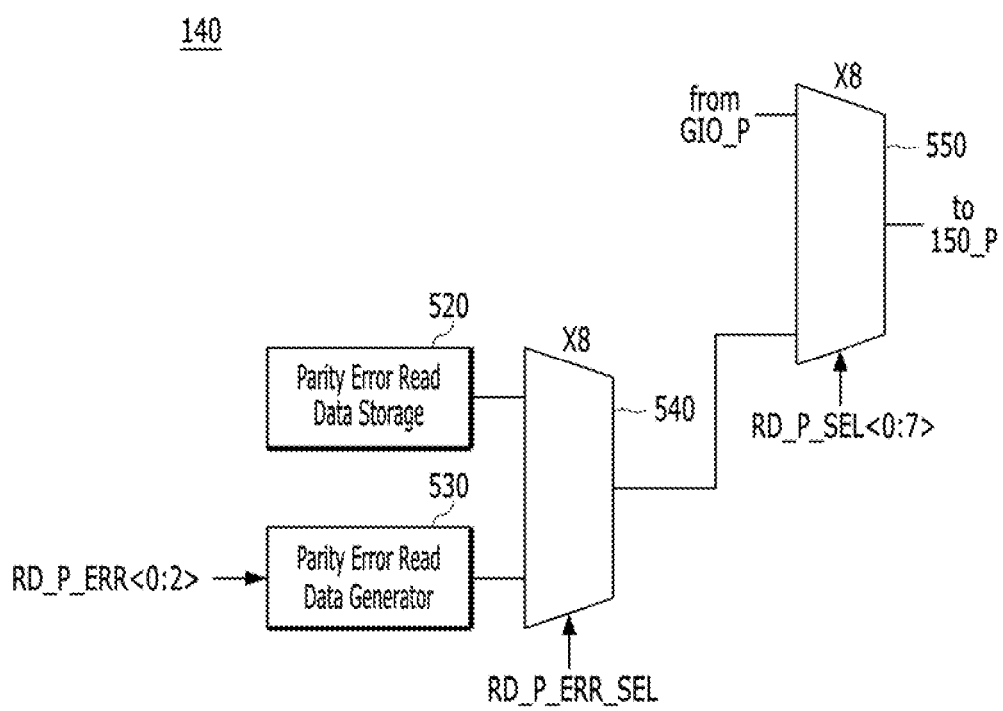
FIG. 5 is a block diagram illustrating a portion of the error injection circuit of FIG. 1 where an error is injected into a plurality of parity input/output sense amplifiers.

FIG. 5 is a block diagram illustrating a portion of the error injection circuit 140 of FIG. 1 employed for injecting an error into a plurality of parity input/output sense amplifiers 160_P.

Referring to FIG. 5, the error injection circuit 140 may include a parity error read data storage 520, a parity error read data generator 530, and seventh and eighth selectors 540 and 550 in addition to the constituent elements of FIGS. 2 to 4.

The parity error read data storage 520 may store first parity error read data that are inputted from the outside of the memory device 100. The parity error read data storage 520 may receive and store the first parity error read data by using some of diverse pads of the memory device 100, such as the data pads DQ_PAD and address pads of the memory device 100. The first parity error read data may be 8 bits.

The parity error read data generator 530 may generate second parity error read data. The parity error read data generator 530 may generate the second parity error read data by selecting a random error or an error of a predetermined pattern in response to the fourth pattern source signals RD_P_ERR<0:2>. To take an example, when the fourth pattern source signals RD_P_ERR<0:2> have a value of '000', the parity error read data generator 530 may generate random 8-bit parity error read data. When the fourth pattern source signals RD_P_ERR<0:2> have a value of '001', the parity error read data generator 530 may generate 8-bit parity error read data having a pattern of '10101010', which is one among predetermined patterns. When the fourth pattern source signals RD_P_ERR<0:2> have a value of '010', the parity error read data generator 530 may generate 8-bit parity error read data having a pattern of '11111111', which is also one among the predetermined patterns. When the fourth pattern source signals RD_P_ERR<0:2> have other values, the parity error read data generator 530 then may generate parity error read data of other patterns.

The seventh selectors 540 may select one of the first parity error read data stored in the parity error read data storage 520 and the second parity error read data generated in the parity error read data generator 530 in response to the fourth error selection signal RD_P_ERR_SEL. In other words, the seventh selectors 540 may select one of the error inputted from the outside of the memory device 100 and the error generated inside the memory device 100. Since the parity error read data are 8 bits, the number of the seventh selectors 540 may be 8.

The selectors 550 may select one of the parity error read data selected by the seventh selectors 540 and the parity read data transferred from the parity local data bus LIO_P, and output the selected data to the parity input/output sense amplifiers 160_P In response to the fourth output selection signals RD_P_SEL<0:7>. The number of the eighth selectors 550 may be 8. Each of the 8 eighth selectors 550 may operate in response to a corresponding one of the 8 fourth output selection signals RD_P_SEL<0:7>. The number of errors in the data that are read by the parity input/output sense amplifiers 160_P may be controlled from 0 to 8 by controlling the levels of the 8 fourth output selection signals RD_P_SEL<0:7>.

The error injection circuit 140 described above, can inject a desired kind of an error as many times as desired into the normal write data and the parity write data in a write operation of the memory device 100. The error injection circuit 140 described above can also inject a desired kind of an error as many times as desired into the normal read data and the parity read data in a read operation of the memory device 100. Therefore, it becomes possible to simulate, analyze and test diverse defect situations of the memory device 100.

According to the embodiments of the present invention, it is possible to efficiently analyze a defect of a memory device.

While the present invention has been described with respect to specific embodiments, it will be apparent to those skilled in the art that various changes and modifications may be made without departing from the spirit and scope of the invention as defined in the following claims.

What is claimed is:

1. A memory device comprising:
   a normal cell array;
   a parity cell array;
   a plurality of normal write drivers suitable for writing normal write data in the normal cell array;
   a plurality of parity write drivers suitable for writing parity write data corresponding to the normal write data, in the parity cell array; and
   an error injection circuit suitable for injecting error write data to at least one among the plurality of the normal write drivers and the plurality of the parity write drivers,
   wherein the error injection circuit includes:
      a normal error write data storage suitable for storing first normal error write data that are inputted from an outside of the memory device;
      a normal error write data generator suitable for generating second normal error write data;
      a first selector suitable for selecting one of the first normal error write data and the second normal error write data to output normal error write data; and
      a second selector suitable for selecting one of the normal write data and the normal error write data, and outputting the selected data to the plurality of the normal write drivers.

2. The memory device of claim 1, wherein the error write data include at least one among an error inputted from outside of the memory device, an error of a predetermined pattern that is generated in the memory device, and a random error that is generated in the memory device.

3. The memory device of claim 1, further comprising:
   a plurality of normal input/output sense amplifiers suitable for reading normal read data from the normal cell array; and
   a plurality of parity input/output sense amplifiers suitable for reading parity read data from the parity cell array,
   wherein the error injection circuit injects error read data to at least one among the plurality of the normal input/output sense amplifiers and the plurality of the parity input/output sense amplifiers.

4. The memory device of claim 3, wherein the error read data include at least one among an error inputted from an outside of the memory device, an error of a predetermined pattern that is generated in the memory device, and a random error that is generated in the memory device.

5. The memory device of claim 3, further comprising:
   a plurality of data pads;
   a plurality of data receiving circuits suitable for receiving the normal write data that are inputted to the plurality of the data pads;
   a plurality of data transferring circuits suitable for transferring the normal read data to the plurality of the data pads; and
   a normal global data bus suitable for transferring the normal write data from the plurality of the data receiving circuits to the plurality of the normal write drivers, and transferring the normal read data to the plurality of the data transferring circuits from the plurality of the normal input/output sense amplifiers.

6. The memory device of claim 5, further comprising:
   a parity generation circuit suitable for generating the parity write data to be written in the parity cell array, based on the normal write data transferred from the plurality of the data receiving circuits;
   an error correction circuit suitable for correcting an error of the normal read data transferred from the plurality of the normal input/output sense amplifiers, based on the parity read data transferred from the plurality of the parity input/output sense amplifiers; and
   a parity global data bus suitable for transferring the parity write data from the parity generation circuit to the plurality of the parity write drivers, and transferring the parity read data from the plurality of the parity input/output sense amplifiers to the error correction circuit.

7. The memory device of claim 1, wherein the error injection circuit further includes:
   a parity error write data storage suitable for storing first parity error write data that are inputted from the outside of the memory device;
   a parity error write data generator suitable for generating second parity error write data;
   a third selector suitable for selecting one of the first parity error write data and the second parity error write data to output parity error write data; and
   a fourth selector suitable for selecting one of the parity write data and the parity error write data, and outputting the selected data to the plurality of the parity write drivers.

8. The memory device of claim 7, wherein the error injection circuit further includes:
   a normal error read data storage suitable for storing first normal error read data that are inputted from the outside of the memory device;
   a normal error read data generator suitable for generating second normal error read data;
   a fifth selector suitable for selecting one of the first normal error read data and the second normal error read data to output normal error read data; and
   a sixth selector suitable for selecting one of the normal read data and the normal error read data, and outputting the selected data to the plurality of the normal input/output sense amplifiers.

9. The memory device of claim 8, wherein the error injection circuit further includes:
   a parity error read data storage suitable for storing first parity error read data that are inputted from the outside of the memory device;
   a parity error read data generator suitable for generating second parity error read data;
   a seventh selector suitable for selecting one of the first parity error read data and the second parity error read data to output parity error read data; and an eighth selector suitable for selecting one of the parity read data and the parity error read data, and outputting the selected data to the plurality of the parity input/output sense amplifiers.

10. A memory device comprising:
a normal cell array;
a parity cell array;
a plurality of normal input/output sense amplifiers suitable for reading normal read data from the normal cell array;
a plurality of parity input/output sense amplifiers suitable for reading parity read data corresponding to the normal read data from the parity cell array; and
an error injection circuit suitable for injecting error read data to at least one among the plurality of the normal input/output sense amplifiers and the plurality of the parity input/output sense amplifiers,
wherein the error injection circuit includes:
a normal error read data storage suitable for storing first normal error read data that are inputted from an outside of the memory device;
a normal error read data generator suitable for generating second normal error read data;
a first selector suitable for selecting one of the first normal error read data and the second normal error read data to output normal error read data; and
a second selector suitable for selecting one of the normal read data and the normal error read data, and outputting the selected data to the plurality of the normal input/output sense amplifiers.

11. The memory device of claim 10, wherein the error read data include at least one among an error inputted from an outside of the memory device, an error of a predetermined pattern that is generated in the memory device, and a random error that is generated in the memory device.

12. The memory device of claim 10, further comprising:
a plurality of data pads;
a plurality of data transferring circuits suitable for transferring the normal read data to the plurality of the data pads;
an error correction circuit suitable for correcting an error of the normal read data transferred from the plurality of the normal input/output sense amplifiers by using the parity read data transferred from the plurality of the parity input/output sense amplifiers so as to produce error-corrected normal read data, and transferring the error-corrected normal read data to the plurality of the data transferring circuits; and
a parity global data bus suitable for transferring the parity read data from the plurality of the parity input/output sense amplifiers to the error correction circuit.

13. The memory device of claim 10, wherein the normal error read data generator generates the second normal error read data in response to a plurality of test mode signals.

14. The memory device of claim 10, wherein the error injection circuit further includes:
a parity error read data storage suitable for storing first parity error read data that are inputted from the outside of the memory device;
a parity error read data generator suitable for generating second parity error read data;
a third selector suitable for selecting one of the first parity error read data and the second parity error read data to output parity error read data; and
a fourth selector suitable for selecting one of the parity read data and the parity error read data, and outputting the selected data to the plurality of the parity input/output sense amplifiers.

15. The memory device of claim 14, wherein the parity error read data generator generates the second parity error read data in response to a plurality of test mode signals.

* * * * *